United States Patent
Joimel et al.

(10) Patent No.: US 11,283,046 B2
(45) Date of Patent: Mar. 22, 2022

(54) ELECTRONIC DEVICE HAVING IMPROVED AGEING RESISTANCE

(71) Applicant: ISORG, Limoges (FR)

(72) Inventors: Jérôme Joimel, Limoges (FR); Eric Faupin, Limoges (FR)

(73) Assignee: ISORG, Limoges (FR)

( * ) Notice: Subject to any disclaimer, the term of this patent is extended or adjusted under 35 U.S.C. 154(b) by 81 days.

(21) Appl. No.: 16/612,262

(22) PCT Filed: May 11, 2018

(86) PCT No.: PCT/FR2018/051160
§ 371 (c)(1),
(2) Date: Nov. 8, 2019

(87) PCT Pub. No.: WO2018/206902
PCT Pub. Date: Nov. 15, 2018

(65) Prior Publication Data
US 2021/0159449 A1    May 27, 2021

(30) Foreign Application Priority Data
May 11, 2017 (FR) ..................................... 17/54149

(51) Int. Cl.
*H01L 51/52* (2006.01)
*H01L 51/10* (2006.01)
(Continued)

(52) U.S. Cl.
CPC ........ *H01L 51/5253* (2013.01); *H01L 51/107* (2013.01); *H01L 51/448* (2013.01); *H01L 51/56* (2013.01)

(58) Field of Classification Search
CPC . H01L 51/5253; H01L 51/107; H01L 51/448; H01L 51/56
See application file for complete search history.

(56) References Cited

U.S. PATENT DOCUMENTS

2004/0135503 A1* 7/2004 Handa ................. H01L 51/5253
                                                        313/511
2016/0204185 A1  7/2016 Iijima et al.
2017/0040570 A1* 2/2017 Kim ........................ H01L 51/56

FOREIGN PATENT DOCUMENTS

EP    2172988 A2    4/2010
FR    2913146 A1    8/2008
(Continued)

OTHER PUBLICATIONS

English Translation, JP2012-84307A, pp. 1-24 (Year: 2012).*
(Continued)

*Primary Examiner* — Shaun M Campbell
(74) *Attorney, Agent, or Firm* — Kaplan Breyer Schwarz, LLP

(57) ABSTRACT

An electronic device includes a substrate, a first oxygen- and water-tight protection layer covering the substrate, at least one electronic component located on the first protection layer and having at least one organic semiconductor region, an oxygen- and water-tight encapsulation layer, the oxygen- and water-tight encapsulation layer having an epoxy or acrylate glue totally covering the organic semiconductor region, a second oxygen- and water-tight protection layer totally covering the encapsulation layer, and a support layer covering the second oxygen- and water-tight protection layer.

10 Claims, 2 Drawing Sheets

(51) Int. Cl.
*H01L 51/44* (2006.01)
*H01L 51/56* (2006.01)

(56) References Cited

FOREIGN PATENT DOCUMENTS

| FR | 2965407 A1 | | 9/2010 | |
|---|---|---|---|---|
| GB | 2395358 A | | 5/2004 | |
| JP | 2012-84307 A | * | 4/2012 | ............ H05B 33/02 |
| WO | 2004/105149 A1 | | 12/2004 | |
| WO | 2012/046741 A1 | | 4/2012 | |

OTHER PUBLICATIONS

English Translation of Written Opinion of the International Searching Authority dated Aug. 14, 2018 issued in International PCT Application No. PCT/FR2018/051160.
Authorized Officer: Pusch, Catharina, International Search Report issued in counterpart PCT application No. PCT/FR2018/051160, dated Aug. 14, 2018, 3 pp.
Examiner: Pusch, Catharina, Search Report issued in counterpart French application No. 17/54149, dated Jan. 30, 2018, 3 pp.

\* cited by examiner

ELECTRONIC DEVICE HAVING IMPROVED AGEING RESISTANCE

The present patent application claims the priority benefit of French patent application FR17/54149 which is herein incorporated by reference.

BACKGROUND

The present application concerns an electronic device comprising at least one organic electronic component and its manufacturing method.

DISCUSSION OF THE RELATED ART

An organic electronic component is an electronic component at least partly made of at least one organic semiconductor material. Examples of organic electronic components are organic transistors, organic photodiodes (OPD), or organic light-emitting diodes (OLED).

Organic semiconductor materials tend to degrade in the presence of air and of water. An organic electronic component may then no longer properly operate after some time. To improve the resistance to aging of an organic electronic component, it is known to sandwich the electronic device comprising the electronic component between air- and water-tight coatings. However, the protection provided by such coatings may be insufficient to prevent a degradation of the organic materials.

SUMMARY

An object of an embodiment is to overcome all or part of the disadvantages of known electronic devices comprising at least one organic electronic component.

Another object of an embodiment is to increase the resistance to aging of the electronic device.

Another object of an embodiment is to improve the protection of the organic electronic component against water and oxygen.

Another object of an embodiment is for all or part of the electronic device to be formed by successive depositions of layers by printing techniques, for example, by inkjet, by heliography, by silk-screening, by flexography, or by slot-die coating.

Thus, an embodiment provides an electronic device comprising:

a substrate;

a first oxygen- and water-tight protection layer covering the substrate;

at least one electronic component located on the first protection layer and comprising at least one organic semiconductor layer;

an oxygen- and water-tight encapsulation layer, comprising an epoxy or acrylate glue, totally covering the organic semiconductor region;

a second oxygen- and water-tight protection layer totally covering the encapsulation layer; and a support layer covering the second protection layer.

According to an embodiment, the substrate and/or the support layer comprises a plastic layer, particularly made of polyethylene naphthalate, of polyethylene terephthalate, of polyimide, of cellulose triacetate, of cycloolefin copolymer, of polyetheretherketone, or of a mixture of these compounds.

According to an embodiment, the first and second protection layers each comprise at least one layer of an inorganic material selected from among silicon nitride, aluminum nitride, aluminum oxide, silicon oxide, and mixtures of at least two of these compounds.

According to an embodiment, the encapsulation layer further extends between the first and second protection layers around the electronic component.

According to an embodiment, the thickness of the encapsulation layer on the electronic component is in the range from 1 µm to 50 µm.

According to an embodiment, the thickness of the first protection layer and/or of the second protection layer is in the range from 10 nm to 500 nm.

According to an embodiment, the electronic component comprises an organic photodiode, an organic light-emitting diode, or an organic transistor.

According to an embodiment, the electronic component comprises:

first and second electrodes extending over the first protection layer;

a first interface layer extending at least partly over the first electrode;

an active organic region at least partly extending on the first interface layer;

a second interface layer at least partly extending on the active region, the encapsulation layer totally covering the second interface layer and the active region.

According to an embodiment, the electronic component is capable of emitting or of capturing an electromagnetic radiation and the active region is the region where most of the electromagnetic radiation supplied by the optoelectronic component is emitted or where most of the conversion of an electromagnetic radiation received by the optoelectronic component into an electric signal occurs.

An embodiment also provides a method of manufacturing an electronic device, comprising the successive steps of:

a) forming a substrate covered with a first oxygen- and water-tight protection layer;

b) forming, on the first protection layer, at least one electronic component comprising at least one organic semiconductor region; and c) gluing a support layer covered with a second oxygen- and water-tight protection layer, on the side of the second protection layer, on the electronic component via an oxygen- and water-tight encapsulation layer, comprising an epoxy or acrylate glue, totally covering the organic semiconductor region.

According to an embodiment, step c) comprises the successive steps of:

depositing precursors of the material of the encapsulation layer at least over a portion of the electronic component;

applying the support layer covered with the second protection layer, on the side of the second protection layer, on the precursors; and crosslinking the precursors.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
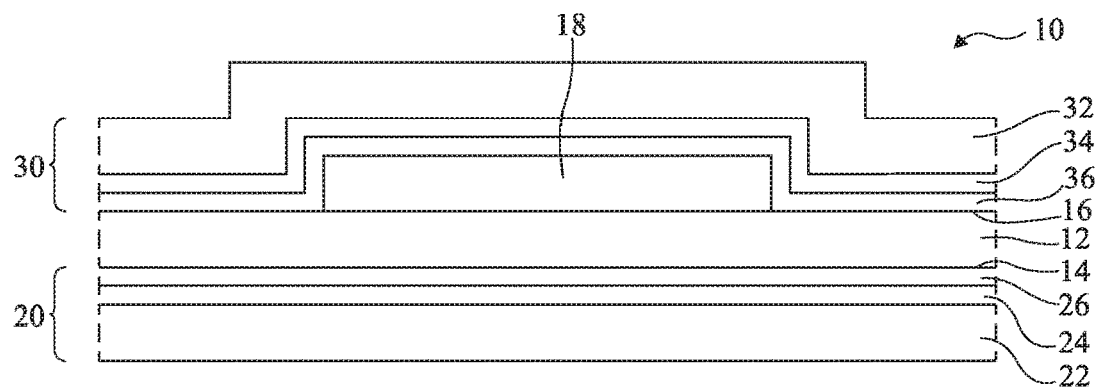
FIG. 1 is a cross-section view of an example of an electronic device comprising an organic electronic component.

The same elements have been designated with the same reference numerals in the different drawings and, further, the various drawings are not to scale.

For clarity, only those elements which are useful to the understanding of the described embodiments have been shown and are detailed.

In particular, the circuits for controlling the organic electronic components are well known by those skilled in the art and are not described.

In the following description, when reference is made to terms qualifying the absolute position, such as terms "high", "low", etc. or the relative position, such as teams "on", "upper", "lower", etc., reference is made to the orientation of the drawings or to an electronic device in a normal position of use. The terms "approximately", "substantially", and "in the order of" are used herein to designate a tolerance of plus or minus 10%, preferably of plus or minus 5%, of the value in question.

In the following description, "active region" of an optoelectronic component designates the region of the optoelectronic component where most of the electromagnetic radiation supplied by the optoelectronic component is emitted or where most of the conversion of an electromagnetic radiation received by the optoelectronic component into an electric signal occurs.

In the following description, a material is said to be oxygen-tight when the permeability of the material to oxygen at 40° C. is lower than $1 \cdot 10^{-1}$ cm$^3$/(m$^2$*day). The permeability to oxygen may be measured according to the ASTM D3985 method entitled "Standard Test Method for Oxygen Gas Transmission Rate Through Plastic Film and Sheeting Using a Coulometric Sensor". In the following description, a material is said to be water-tight when the permeability of the material to water at 40° C. is smaller than $1 \cdot 10^{-1}$ g/(m$^2$*day). The permeability to water may be measured according to the ASTM F1249 method entitled "Standard Test Method for Water Vapor Transmission Rate Through Plastic Film and Sheeting Using a Modulated Infrared Sensor".

FIG. 1 shows an example of an electric device 10. Device 10 comprises:

a substrate 12 having a lower surface 14 and an upper surface 16 opposite to lower surface 14;

at least one organic electronic component 18 on surface 16, the internal structure of which is not shown in FIG. 1;

a first coating 20, or lower coating, on the side of surface 14 and comprising a stack comprising a support layer 22, a protection layer 24 covering support layer 22, and a glue layer 26 covering protection layer 24 and allowing the gluing of protection layer 24 to surface 14; and a second coating 30, or upper coating, on the side of surface 16 and comprising a stack comprising a support layer 32, a protection layer 34 covering support layer 32, and a glue layer 36 covering protection layer 34 and allowing the gluing of protection layer 34 to organic electronic component 18 and to surface 16 around organic electronic component 18.

Organic electronic component 18 may be an optoelectronic component. An organic optoelectronic component generally comprises an active area made of organic materials where the conversion of an electromagnetic radiation into an electric signal is performed.

Coatings 20 and 30 may correspond to products available for sale. Coatings 20, 30 may be arranged in place by lamination on surfaces 14 and 16 and on electronic device 18.

Each support layer 22, 32 may be made of a plastic material.

Each protection layer 24, 34 is a substantially air- and water-tight layer. Each protection layer 24, 34 may have a monolayer structure or a multilayer structure. According to an embodiment, each protection layer 24, 34 may comprise a stack of at least one layer of an inorganic material and of at least one layer of an organic material. Examples of inorganic materials are silicon nitride, aluminum nitride, aluminum oxide, silicon oxide, and mixtures of at least two of these compounds. Examples of inorganic materials are polyacrylates. The thickness of protection layer 24, 34 may be in the range from 500 nm to 500 μm.

Glue layers 26, 36 may be made of a pressure-sensitive adhesive (PSA).

Figure 2:
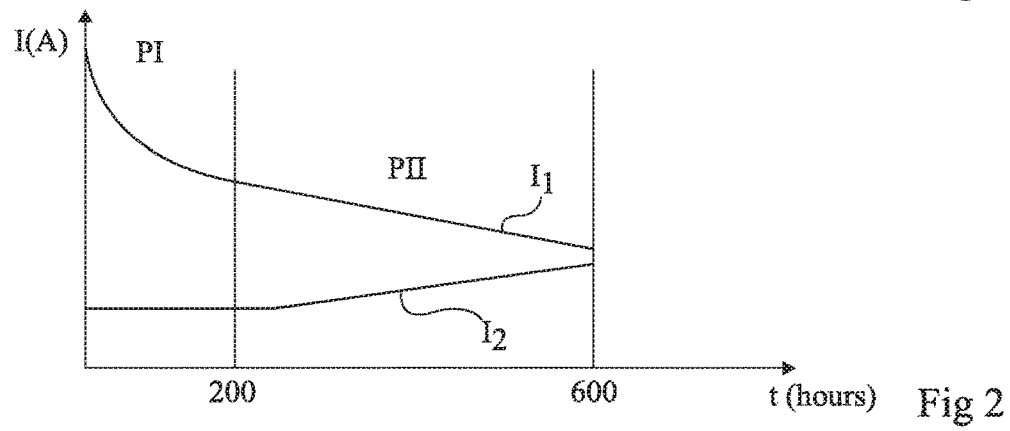
FIG. 2 shows curves of variation of the illumination current and of the dark current of an organic photodiode of an electronic device having the structure shown in FIG. 1.

FIG. 2 shows curves $I_1$ and $I_2$ obtained in the case where the electronic component 18 of the electric device 10 shown in FIG. 1 comprises a photodiode, reverse biased with a constant voltage. Curve $I_1$ corresponds to the curve of the time variation of the current flowing through the photodiode when it is illuminated, also called illumination current, and curve $I_2$ corresponds to the curve of the time variation of the current flowing through the photodiode in the absence of an illumination, also called dark current.

Curve $I_1$ successively comprises a first phase PI during which illumination current $I_1$ decreases rapidly and a second phase PII during which illumination current $I_1$ decreases slower. Curve $I_2$ comprises a first phase, generally next to phase PI, during which dark current $I_2$ is substantially constant and a second phase during which dark current $I_2$ increases.

There exist criteria to quantify the time variations of the properties of electronic component 18, which are representative of the aging of electronic component 18, and to deduce therefrom whether electronic component 18 operates properly. As an example, in the case of a photodiode, it may be considered that photodiode 18 does not operate properly if the decrease of illumination current $I_1$ since the first starting of the photodiode is greater than 15% or if the intensity of dark current $I_2$ is greater than $1 \cdot 10^{-7}$ A measured with a −8-V bias voltage. The resistance to aging of an electronic photodiode 18 of an electronic device 10 having the structure shown in FIG. 1 may be approximately 200 hours.

It would be desirable to improve the resistance to aging of organic electronic component 18.

Figure 3:
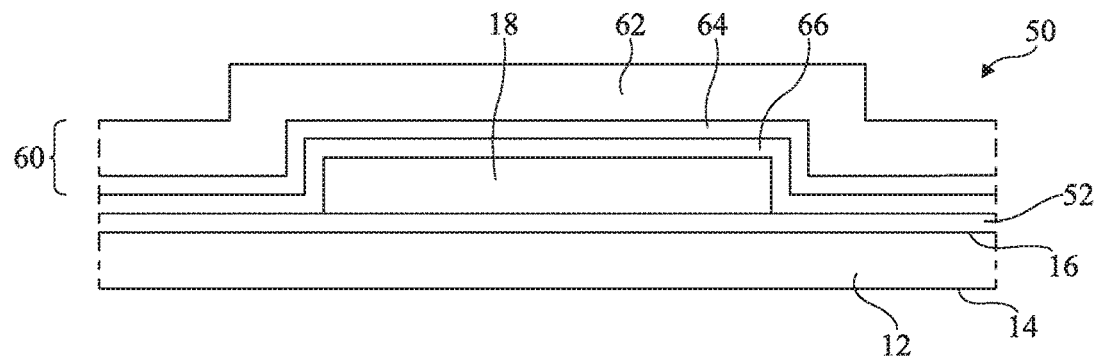
FIG. 3 is a cross-section view of an embodiment of an electronic device comprising an organic electronic component.

FIG. 3 shows an embodiment of an electronic device 50 with an improved resistance to aging. Electronic device 50 comprises the substrate 12 and the organic electronic component 18 of the electric device 10 shown in FIG. 1. However, conversely to electronic device 1, electronic device 50 comprises a first protection layer 52, or lower protection layer, arranged between substrate 12 and organic electronic component 18 and which is in contact with surface 16 of substrate 12 and in contact with organic electronic component 18. Electronic component 50 further comprises a coating 60 comprising a support layer 62 and a second protection layer 64, called upper protection layer, which covers support layer 12. Electronic device 50 further comprises an encapsulation layer 66 arranged between upper protection layer 64 and organic electronic component 18 and between upper protection layer 64 and lower protection layer 52 around organic electronic component 18.

Lower protection layer 52 and upper protection layer 64 may each have the same structure as the previously-described protection layers 24, 34.

The thickness of substrate 12 may be in the range from 5 µm to 1,000 µm. Substrate 12 may be a rigid substrate or a flexible substrate. An example of a rigid substrate comprises a silicon, germanium, or glass substrate. Preferably, substrate 12 is a flexible film. An example of flexible substrate comprises a film of PEN (polyethylene naphthalate), PET (polyethylene terephthalate), PI (polyimide), TAC (cellulose triacetate), COP (cycloolefin copolymer), or PEEK (polyetheretherketone). Substrate 12 may have a thickness from 10 µm to 300 µm, preferably from 75 µm to 250 µm, particularly in the order of 125 µm, and may have a flexible behavior, that is, substrate 12 may, under the action of an external force, deform, and particularly bend, without breaking or tearing. Support layer 62 may have the same structure as substrate 12 when the latter corresponds to a flexible substrate. During the method of manufacturing electronic device 50, substrate 12 may be temporarily bonded to a handle.

Encapsulation layer 66 is substantially air- or water-tight. The material forming encapsulation layer 66 is selected from the group comprising a polyepoxide or a polyacrylate. Among polyepoxides, the material forming encapsulation layer 66 may be selected from the group comprising bisphenol A epoxy resins, particularly the diglycidylether of bisphenol A (DGEBA) and the diglycidylethers of bisphenol A and of tetrabromobisphenol A, bisphenol F epoxy resins, novolac epoxy resins, particularly epoxy-phenol-novolacs (EPN) and epoxy-cresol-novolacs (ECN), aliphatic epoxy resins, particularly epoxy resins with glycidyl groups and cycloaliphatic epoxides, glycidyl amine epoxy resins, particularly the glycidyl ethers of methylene dianiline (TGMDA), and a mixture of at least two of these compounds. Among polyacrylates, the material forming encapsulation layer 66 may be made from monomers comprising acrylic acids, methylmethacrylate, acrylonitrile, methacrylates, methyl acrylate, ethyl acrylate, 2-chloroethyl vinyl ether, 2-ethylhexyl acrylate, hydroxyethyl methacrylate, butyl acrylate, butyl methacrylate, trimethylolpropane triacrylate (TMPTA), or derivatives of these products.

The thickness of the encapsulation layer 66 covering organic electronic component 18 is in the range from 1 µm to 50 µm, preferably from 5 µm to 40 µm, particularly in the order of 15 µm.

Figure 4:
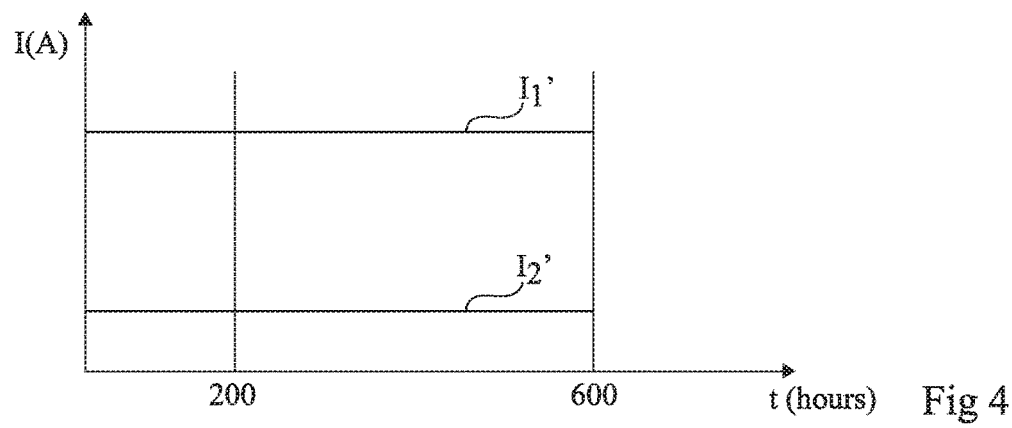
FIG. 4 shows curves of variation of the illumination current and of the dark current of an organic photodiode of an electronic device having the structure shown in FIG. 3.

FIG. 4 shows curves of variation of the illumination current $I_1'$ and of the dark current $I_2'$ obtained in the case where the electronic component 18 of electric device 50 shown in FIG. 3 comprises a photodiode reverse-biased with a constant voltage. As appears in the drawing, illumination current $I_1'$ is substantially constant for at least 600 hours and dark current $I_2'$ is substantially constant for at least 600 hours. The resistance to aging of organic electronic component 18 of electronic device 50 having the structure shown in FIG. 3 is thus increased.

The protection of organic electronic component 18 against water and oxygen is achieved by protection layers 52, 64 and encapsulation layer 66, which form a barrier totally surrounding organic electronic component 18, possibly except local areas provided to connect organic electronic component 18 to an electronic circuit, not shown, external to electronic device 50.

At least certain elements of organic electronic component 18 and of encapsulation layer 66 may be formed by a so-called additive method, for example, by direct printing of the adapted material at the desired locations, for example, by inkjet printing, photogravure, silk-screening, flexography, spray coating, or drop casting. At least certain elements of organic electronic component 18 and of encapsulation layer 66 may be formed by a so-called subtractive method, where the adapted material is deposited all over the structure and where the non-used portions are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used.

At least certain elements of organic electronic component 18 and of encapsulation layer 66, preferably the entire organic electronic component 18 and the entire encapsulation layer 66, may be formed by printing techniques.

According to an embodiment of the method of manufacturing electronic device 50, lower protection layer 52 may be deposited on substrate 12 by evaporation. According to an embodiment, upper protection layer 64 may be deposited on support layer 62 by evaporation.

According to an embodiment of the method of manufacturing electronic device 50, after organic electronic component 18 has been formed on lower protection layer 52, encapsulation layer 66 may be formed by the deposition of precursors of the material forming encapsulation layer 66, for example, an epoxy or acrylate glue, at the desired location, by silk-screening, particularly on organic electronic component 18 and possibly over at least a portion of lower protection layer 52 around organic electronic component 18. Preferably, the precursors are not deposited over the entire lower protection layer 52 around organic electronic component 18.

Coating 60, comprising support 62 covered with upper protection layer 64, may then be deposited on organic electronic component 18 and on lower protection layer 52 around organic electronic component 18 by lamination. It may be a hot film lamination, cold lamination, or vacuum lamination method. The lamination operation further causes a spreading of the precursors of the material forming encapsulation layer 66 between upper protection layer 64 and organic electronic component 18, and between upper protection layer 64 and lower protection layer 52 around organic electronic component 18.

A step of crosslinking of the precursors of the material forming encapsulation layer 66 is then carried out to obtain encapsulation layer 66, for example by exposure of the structure to an ultraviolet radiation. As an example, the ultraviolet radiation may have a wavelength smaller than or equal to 400 nm. The energy of the ultraviolet radiation may be greater than or equal to 100 mJ/cm$^2$.

Encapsulation layer 66 plays the role of glue between coating 60 and organic electronic component 18 and between coating 60 and lower barrier layer 52. A substantially oxygen- and water-tight barrier, formed by protection layers 52, 64 and encapsulation layer 66, then totally surrounds organic electronic component 18. Even if, during the lamination operation, air bubbles are trapped between upper protection layer 64 and encapsulation layer 66, encapsulation layer 66 is sufficient to protect organic electronic component 18 against such air bubbles. The air and oxygen tightness of encapsulation layer 66 may be lower than the water and oxygen tightness provided by protection layers 52, 64. It is therefore advantageous to provide upper protection layer 64. It is however advantageous for the material forming encapsulation layer 66 to have, in addition to the bonding properties, a water and oxygen tightness. Indeed, protection layer 66 provides a barrier against the penetration of water and of oxygen on the lateral edge of electronic device 50.

Figure 5:
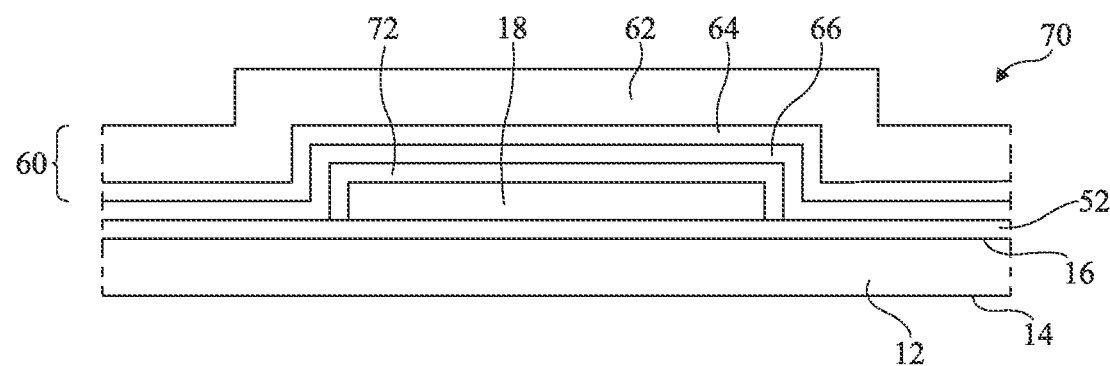
FIG. 5 is a cross-section view of another embodiment of an electronic device comprising an organic electronic component.

FIG. 5 shows another embodiment of an electronic device 70 with an improved resistance to aging. Electronic device 70 comprises all the elements of the electronic device 50 shown in FIG. 3 and further comprises an insulating layer 72 located between encapsulation layer 66 and organic electronic component 18. Insulating layer 72 may totally cover electronic component 18. Insulating layer 72 may be in contact with organic electronic component 18. Encapsulation layer 66 may be in contact with insulating layer 72. Insulating layer 72 may comprise an organic insulating material, for example, parylene. The thickness of insulating layer 72 may be in the range from 20 nm to 1 µm. Insulating layer 72 may play a protection layer role in the case where at least certain materials of electronic component 18 are capable of reacting with the material of encapsulation layer 66 and/or the precursors of the material of encapsulation layer 66.

Figure 6:
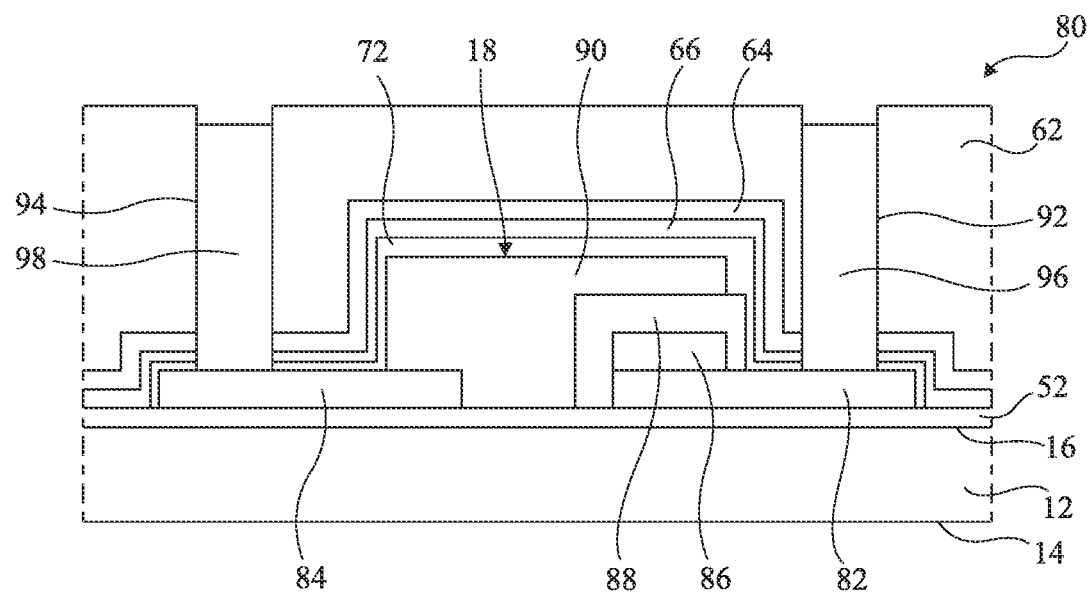
FIG. 6 shows a more detailed embodiment of an optoelectronic device comprising an organic photodiode.

FIG. 6 shows an embodiment of an electronic device 80 having the same structure as electronic device 50, shown in FIG. 3, in the case where optoelectronic component 18 comprises a photodiode. Electronic device 80 comprises all the elements of electronic device 50 and further comprises:

a first electrode 82 and a second electrode 84 in contact with lower protection layer 52 and covering lower protection layer 52;

a first interface layer 86, or lower interface layer 86, in contact with first electrode 82 and partly or totally covering the first electrode 82;

an active region 88 in contact with lower interface layer 86, partly or totally covering lower interface layer 86 and capable of partially covering first electrode 82 and/or lower protection layer 52;

a second interface layer 90, or upper interface layer 90, in contact with active region 88 and partially or totally covering active region 88, upper interface layer 90 being further in contact with second electrode 84 and partially covering second electrode 84, encapsulation layer 66 being in contact with upper interface layer 90, with electrodes 82, 84, and with lower protection layer 52 and possibly in contact with active region 88 when active region 88 is not totally covered with upper interface layer 90 and covering the portions which are not already covered of upper interface layer 90, of active region 88, of electrodes 82, 84, and of lower protection layer 52;

possibly a first opening 92 crossing support layer 62 and upper protection layer 64 and exposing a portion of the first electrode 82 and a second opening 94 crossing support layer 62 and upper protection layer 64 and exposing a portion of second electrode 84; and a first conductive pad 96 in first opening 92 in contact with first electrode 82 and a second conductive pad 98 in second opening 94 in contact with second electrode 84.

According to an embodiment, the material forming electrodes 82, 84 is selected from the group comprising:

a transparent conductive oxide (TCO), particularly ITO, an aluminum zinc oxide (AZO), a gallium zinc oxide (GZO), an ITO/Ag/ITO alloy, an AZO/Ag/AZO alloy, or a ZnO/Ag/ZnO alloy;

a metal, for example, silver, gold, lead, palladium, copper, nickel, tungsten, or chromium;

carbon, silver, and copper nanowires;

graphene; and a mixture of at least two of these materials.

The thickness of each electrode 82, 84 is in the range from 10 nm to 5 µm, preferably from 50 nm to 1 µm, particularly in the order of 130 nm. Preferably, electrodes 82, 84 are made of a conductive and at least partially transparent material, for example, made of indium tin oxide or ITO.

Interface layer 86 or 90 may correspond to an electron injection layer or to a hole injection layer. The work function of interface layer 86 or 90 is adapted to blocking, collecting, or injecting holes and/or electrons according to whether the interface layer plays the role of a cathode or of an anode. More particularly, when interface layer 86 or 90 plays the role of an anode, it corresponds to a hole injection and electron blocking layer. The work function of interface layer 86 or 90 is then greater than or equal to 4.5 eV, preferably greater than or equal to 5 eV. When interface layer 86 or 90 plays the role of a cathode, it corresponds to an electron injection and hole blocking layer. The work function of interface layer 86 or 90 is then smaller than or equal to 4.5 eV, preferably smaller than or equal to 4.2 eV.

In the case where interface layer 86 or 90 plays the role of an electron injection layer, the material forming interface layer 86 or 90 is selected from the group comprising:

a metal oxide, particularly a titanium oxide or a zinc oxide;

a molecular host/dopant system, particularly the products commercialized by Novaled under trade names NET-5/NDN-1 or NET-8/MDN-26;

a conductive or doped semiconductor polymer, for example, the PEDOT:Tosylate polymer, which is a mixture of poly(3,4)-ethylenedioxythiophene and of tosylate;

a carbonate, for example CsCO3;

a polyelectrolyte, for example, poly[9,9-bis(3'-(N,N-dimethylamino)propyl)-2,7-fluorene-alt-2,7-(9,9-dioctyfluorene)] (PFN), poly[3-(6-trimethylammoniumhexyl] thiophene (P3TMAHT) or poly[9,9-bis(2-ethylhexyl)fluorene]-b-poly[3-(6-trimethylammoniumhexyl] thiophene (PF2/6-b-P3TMAHT);

a polyethyleneimine (PEI) polymer or a polyethyleneimine ethoxylated (PEIE), propoxylated, and/or butoxylated polymer; and a mixture of two or more of these materials.

Preferably, lower interface layer 86 plays the role of an electron injection layer and is made of a polyethyleneimine ethoxylated polymer.

In the case where interface layer 86 or 90 plays the role of a hole injection layer, the material forming interface layer 86 or 90 may be selected from the group comprising:

a conductive or doped semiconductor polymer, particularly the materials commercialized under trade names Plexcore OC RG-1100, Plexcore OC RG-1200 by Sigma-Aldrich, the PEDOT:PSS polymer, which is a mixture of poly(3,4)-ethylenedioxythiophene and of sodium polystyrene sulfonate, or a polyaniline;

a molecular host/dopant system, particularly the products commercialized by Novaled under trade names NHT-5/NDP-2 or NHT-18/NDP-9;

a polyelectrolyte, for example, Nafion;

a metal oxide, for example, a molybdenum oxide, a vanadium oxide, ITO, or a nickel oxide; and a mixture of two or more of these materials.

Preferably, in the case where interface layer 86 or 90 plays the role of a hole injection layer, the material forming interface layer 86 or 90 is a conductive or doped semiconductor polymer.

Preferably, upper interface layer 90 plays the role of a hole injection layer and is made of PEDOT:PSS. An advantage of PEDOT:PSS is that it may be easily deposited by printing techniques, for example, by inkjet, by heliography, by silk-screening, by slot-die coating, or by slot-die coating. The thickness of upper interface layer 90 covering active region 88 is in the range from 10 nm to 10 µm, preferably from 100 nm to 1 µm, particularly in the order of 500 nm.

According to the implemented manufacturing method, a layer of the material used for lower interface layer 86 may further be present between electrode 84 and upper interface layer 90.

Active region 88 comprises at least one organic material and may comprise a stack or a mixture of a plurality of organic materials. Active region 88 may comprise a mixture of an electron donor polymer and of an electron acceptor molecule. The functional area of active region 88 is delimited by the overlapping of lower interface layer 86 and of upper interface layer 90. The currents crossing the functional area of active region 88 may vary from a few picoamperes to a few microamperes. The thickness of active region 88 covering lower interface layer 86 may be in the range from 50 nm to 1 µm, for example, in the order of 500 nm.

Active region 88 may comprise small molecules, oligomers, or polymers. These may be organic or inorganic materials. Active layer 88 may comprise an ambipolar semiconductor material, or a mixture of an N-type semiconductor material and of a P-type semiconductor material, for example in the form of stacked layers or of an intimate mixture at a nanometer scale to form a bulk heterojunction.

Example of P-type semiconductor polymers capable of forming active region 88 are poly(3-hexylthiophene) (P3HT), poly[N-9'-heptadecanyl-2,7-carbazole-alt-5,5-(4,7-di-2-thienyl-2',1',3'-benzothiadiazole] (PCDTBT), Poly[(4,8-bis-(2-ethylhexyloxy)-benzo[1,2-b;4,5-b']dithiophene)-2,6-diyl-alt-(4-(2-ethylhexanoyl)-thie-no[3,4-b]thiophene))-2,6-diyl]; 4,5-b']dithi-ophene)-2,6-diyl-alt-(5,5'-bis(2-thienyl)-4,4,-dinonyl-2,2'-bithiazole)-5',5"-diyl] (PBDTTT-C), le poly[2-methoxy-5-(2-ethyl-hexyloxy)-1,4-phenylene-vinylene] (MEH-PPV) or Poly[2,6-(4,4-bis-(2-ethylhexyl)-4H-cyclopenta [2,1-b;3,4-b']dithiophene)-alt-4,7(2,1,3-benzothiadiazole)] (PCPDTBT).

Examples of N-type semiconductor materials capable of forming active region 88 are fullerenes, particularly C60, [6,6]-phenyl-$C_{61}$-methyl butanoate ([60]PCBM), [6,6]-phenyl-$C_{71}$-methyl butanoate ([70]PCBM), perylene diimide, zinc oxide (ZnO), or nanocrystals enabling to form quantum dots.

The thickness of the stack comprising lower interface layer 86, active region 88, and upper interface layer 90 is in the range from 1 µm to 4 µm, preferably from 1.5 µm to 2 µm.

Figure 7:
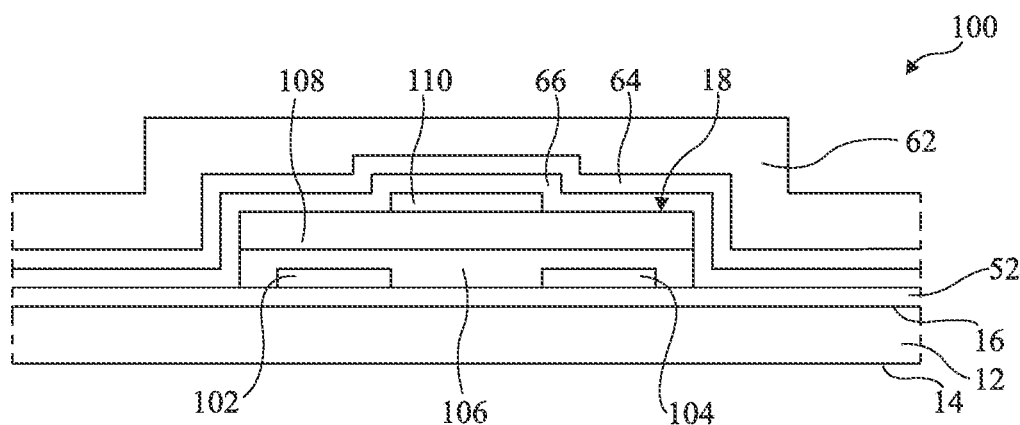
FIG. 7 shows a more detailed embodiment of an optoelectronic device comprising an organic transistor.

FIG. 7 shows an embodiment of an electronic device 100 having the same structure as electronic device 50, shown in FIG. 3, in the case where optoelectronic component 18 comprises a so-called "high-gate" organic transistor. Electronic device 100 comprises all the elements of electronic device 50 and further comprises:

conductive portions 102, 104 on lower protection layer 52;

a semiconductor layer 106 covering conductive portions 102, 104 and lower protection layer 52 between conductive portions 102, 104;

an insulating layer 108 covering semiconductor layer 106; and a conductive portion 110 on insulating layer 108.

Conductive portion 110 forms the transistor gate. Insulating layer 108 corresponds to the transistor gate. Conducting portions 102 and 104 form the drain and source contacts of the transistor. The transistor channel is formed in semiconductor layer 106.

Conductive portions 102, 104, and 110 may have the same structure and the same composition as previously-described electrodes 82, 84.

As a variation, optoelectronic component 18 may comprise a so-called "low-gate" organic transistor. In this case, conductive portion 110, forming the transistor gate, is located on lower protection layer 52 and is covered with insulating layer 108 and insulating layer 108 is covered with semiconductor layer 106 having conductive portions 102 and 104 formed thereon.

Specific embodiments have been described. Various alterations, modifications, and improvements will readily occur to those skilled in the art. In particular, even though, in the previously described embodiments, the electronic device comprises a single electronic component, it should be clear that the electronic device may comprise a plurality of electronic components, particularly, a plurality of photodiodes of light-emitting diodes, photodiodes, and transistors, or light-emitting diodes and transistors.

The invention claimed is:

1. An electronic device comprising:
   a substrate;
   a first oxygen- and water-tight protection layer covering the substrate;
   at least one electronic component located on the first protection layer and comprising at least one organic semiconductor region, wherein the electronic component comprises:
      first and second electrodes extending over the first protection layer;
      a first interface layer at least partly extending over the first electrode;
      an organic active region at least partly extending over the first interface layer;
      a second interface layer at least partly extending over the active region;
      an insulating parylene layer covering the electronic component;
   an oxygen- and water-tight encapsulation layer, comprising an epoxy or acrylate glue, totally covering the organic semiconductor region, the insulating layer being located between the encapsulation layer and the electronic component, the encapsulation layer totally covering the second interface layer and the active region;
   a second oxygen- and water-tight protection layer totally covering the encapsulation layer;
   a support layer covering the second protection layer;

a first opening crossing the support layer and the second protection layer and exposing a portion of the first electrode;

a second opening crossing the support layer and the second protection layer and exposing a portion of the second electrode;

a first conductive pad in the first opening in contact with the first electrode; and a second conductive pad in the second opening in contact with the second electrode.

2. The electronic device of claim 1, wherein the substrate and/or the support layer comprises a plastic layer made of polyethylene naphthalate (PEN), of polyethylene terephthalate (PET), of polyimide (PI), of cellulose triacetate (TAC), of cycloolefin copolymer (COP), of polyetheretherketone (PEEK), or of a mixture of these compounds.

3. The electronic device of claim 1, wherein the first and second protection layers each comprise at least one layer of an inorganic material selected from silicon nitride, aluminum nitride, aluminum oxide, silicon oxide, and mixtures of at least two of these compounds.

4. The electronic device of claim 1, wherein the encapsulation layer further extends between the first and second protection layers around the electronic component.

5. The electronic device of claim 1, wherein the thickness of the encapsulation layer on the electronic component is in the range from 1 µm to 50 µm.

6. The electronic device of claim 1, wherein the thickness of the first protection layer and/or of the second protection layer is in the range from 10 nm to 500 nm.

7. The electronic device of claim 1, wherein the electronic component comprises an organic photodiode, an organic light-emitting diode, or an organic transistor.

8. The electronic device of claim 1, wherein the electronic component is capable of emitting or of capturing an electromagnetic radiation and wherein the active region is the region where most of the electromagnetic radiation supplied by an optoelectronic component is emitted or where most of the conversion of an electromagnetic radiation received by the optoelectronic component into an electric signal occurs.

9. A method of manufacturing an electronic device comprising the successive steps of:

a) forming a substrate covered with a first oxygen- and water-tight protection layer;

b) forming, on the first protection layer, at least one electronic component comprising at least one organic semiconductor region and an insulating parylene layer covering the electronic component, wherein the electronic component comprises:

first and second electrodes extending over the first protection layer;

a first interface layer at least partly extending over the first electrode;

an organic active region at least partly extending over the first interface layer;

a second interface layer at least partly extending over the active region; and c) gluing a support layer covered with a second oxygen- and water-tight protection layer, on the side of the second protection layer, on the electronic component via an oxygen- and water-tight encapsulation layer, comprising an epoxy or acrylate glue, totally covering the organic semiconductor region, the insulating layer being located between the encapsulation layer and the electronic component, the encapsulation layer totally covering the second interface layer and the active region; and d) forming a first opening crossing the support layer and the second protection layer and exposing a portion of the first electrode, a second opening crossing the support layer and the second protection layer and exposing a portion of the second electrode, a first conductive pad in the first opening in contact with the first electrode, and a second conductive pad in the second opening in contact with the second electrode.

10. The method of claim 9, wherein step c) comprises the successive steps of:

depositing precursors of the material of the encapsulation layer at least over a portion of the electronic component;

applying the support layer covered with the second protection layer, on the side of the second protection layer, on the precursors; and crosslinking the precursors.

* * * * *